United States Patent
Reuveni et al.

(10) Patent No.: US 6,567,022 B1
(45) Date of Patent: May 20, 2003

(54) MATCHING CALIBRATION FOR DUAL ANALOG-TO-DIGITAL CONVERTERS

(75) Inventors: David R. Reuveni, Taufkirchen (DE); Stefan G. Block, Munich (DE)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 10/217,051

(22) Filed: Aug. 12, 2002

(65) Prior Publication Data

(65)

(51) Int. Cl.[7] ................................................ H03M 1/10
(52) U.S. Cl. ...................... 341/120; 341/118; 341/155; 341/156
(58) Field of Search ................................ 341/120, 139, 341/155, 156, 118, 159

(56) References Cited

U.S. PATENT DOCUMENTS

| | | | | |
|---|---|---|---|---|
| 4,143,361 A | * | 3/1979 | Tammes et al. ............ 341/118 |
| 5,164,726 A | * | 11/1992 | Bernstein et al. ........... 341/120 |
| 5,412,385 A | * | 5/1995 | Mangelsdorf ............... 341/120 |
| 5,818,370 A | * | 10/1998 | Sooch et al. ................ 341/120 |
| 6,516,185 B1 | * | 2/2003 | MacNally ................. 455/234.1 |

\* cited by examiner

Primary Examiner—Brian Young
Assistant Examiner—John Nguyen
(74) Attorney, Agent, or Firm—Westman, Champlin & Kelly

(57) ABSTRACT

A method and apparatus are provided for calibrating first and second analog-to-digital converters (ADCs). The apparatus applies a test signal to the first and second ADCs. A first correction value is applied to an output of the first ADC to produce a first corrected output. A second correction value is applied to an output of the second ADC to produce a second corrected output. The first and second corrected outputs are then compared to identify a greater one and a lesser one of the first and second corrected outputs. At least one of the first and second correction values are adjusted relative to the other until the first or second corrected output that was identified as the lesser one exceeds the other.

15 Claims, 2 Drawing Sheets

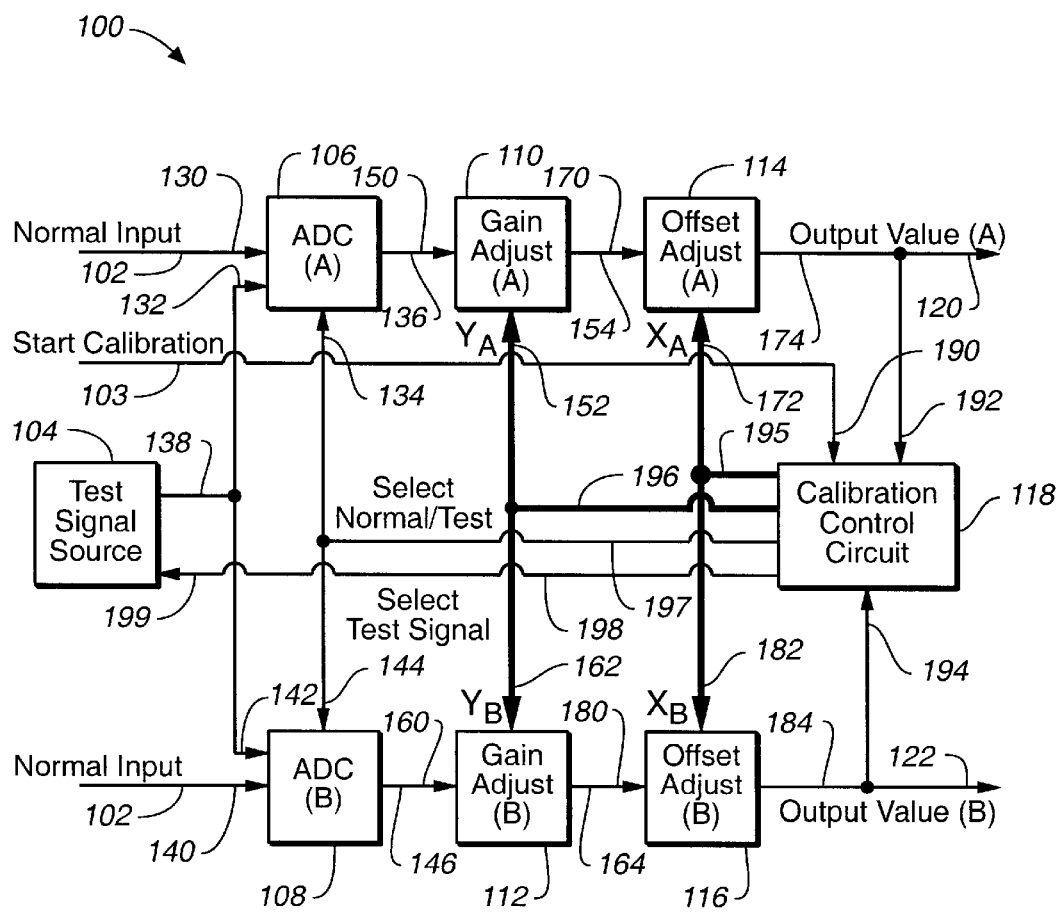
FIG._1

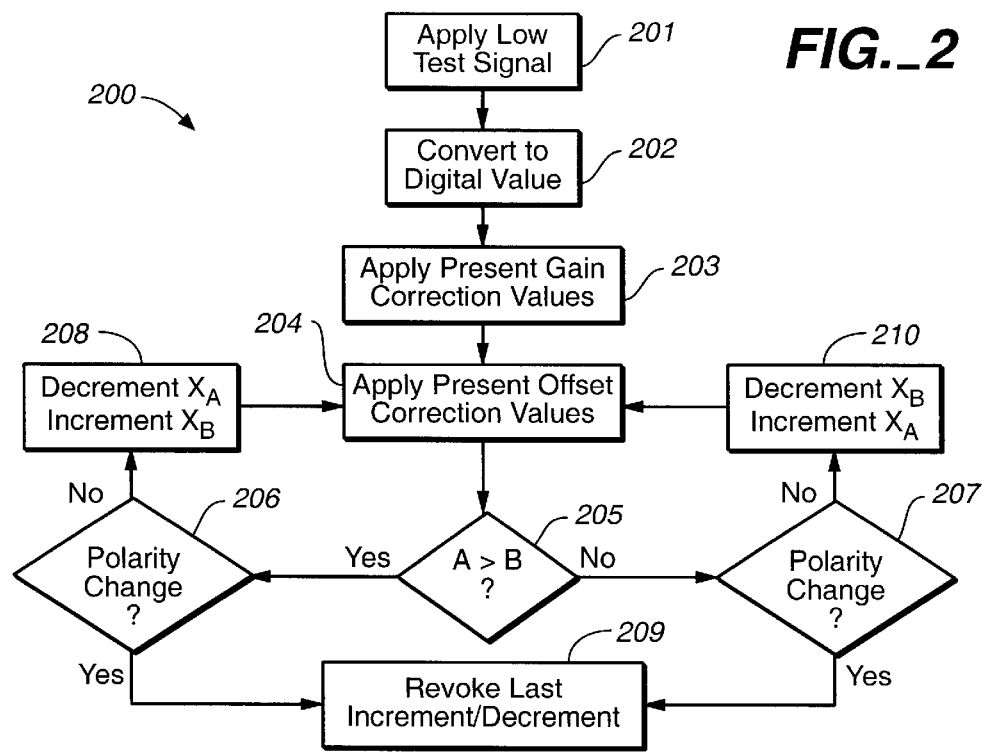
FIG._2
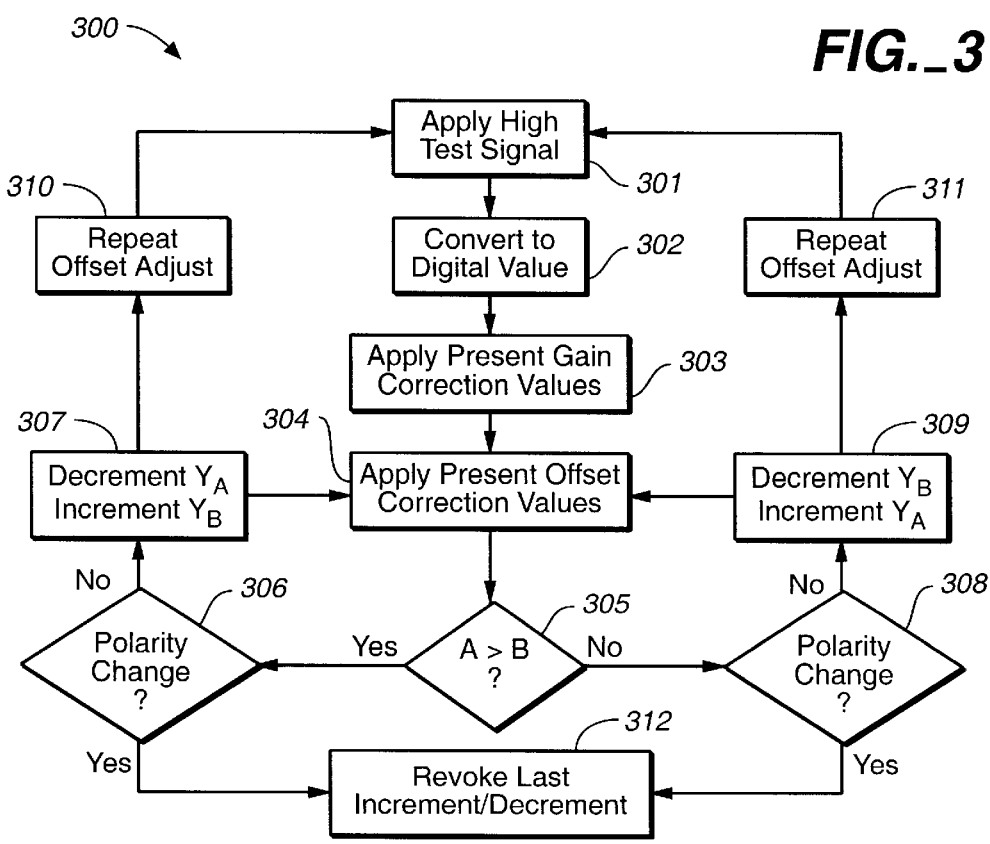
FIG._3

MATCHING CALIBRATION FOR DUAL ANALOG-TO-DIGITAL CONVERTERS

BACKGROUND OF THE INVENTION

The present invention relates to the conversion of analog signals to digital values and, more specifically to a calibration technique for matching the gain and offset characteristics of two analog-to-digital converters of the same type.

Analog-to-digital converters (ADCs) convert analog signals by sampling the signals and converting the samples into digital values. ADCs are used in a wide range of applications. In some applications, two or more ADCs are used in parallel with one another. In these applications, it is desirable for the gain and offset characteristics of each ADC to be the same as the characteristics of the other ADCs.

For example, two or more matched ADCs can be used to acquire two or more channels of analog data into a digital system. One of the most exacting applications that requires very closely matched gain and offset characteristics is when two or more ADCs are required to operate in an interleaved mode in order to provide digital data from an analog signal source at a higher speed than a single unit can convert. Such interleaved modes can be required in satellite and terrestrial data communication applications, for example. Each ADC preferably generates the same output value for a given analog input level. Any gain and offset differences between interleaved ADCs in these systems can cause data communication errors.

A technique is therefore desired for calibrating multiple ADCs simultaneously such that they have similar gain and offset characteristics, with a calibration performance that is acceptable in an interleaved mode of operation and all less exacting modes of operation.

SUMMARY OF THE INVENTION

One embodiment of the present invention is directed to a method for calibrating first and second analog-to-digital converters (ADCs). According to the method, a test signal is applied to the first and second ADCs. A first correction value is applied to an output of the first ADC to produce a first corrected output. A second correction value is applied to an output of the second ADC to produce a second corrected output. The first and second corrected outputs are then compared to identify a greater one and a lesser one of the first and second corrected outputs. At least one of the first and second correction values are adjusted relative to the other until the first or second corrected output that was identified as the lesser one exceeds the other.

Another embodiment of the present invention is directed to an analog-to-digital converter (ADC) system. The system includes a normal analog input, a test analog input, first and second ADCs, first and second correction circuits and a calibration circuit. The first ADC selectively operates on either the normal analog input or the test analog input and has a digital output. The second ADC selectively operates on either the normal analog input or the test analog input and has a digital output. The first correction circuit is adapted to modify the digital output of the first ADC by a first gain correction value and a first offset correction value to produce a first corrected output. The second correction circuit is adapted to modify the digital output of the second ADC by a second gain correction value and a second offset correction value to produce a second corrected output. The calibration control circuit has first and second comparison inputs coupled to the first and second corrected outputs, respectively, and generates the first and second gain correction values and the first and second offset correction values as a function of a comparison of the first and second corrected outputs.

Yet another embodiment of the present invention is directed to a multiple analog-to-digital converter (ADC) system. The system includes a normal analog input and a test analog input. First and second ADCs selectively operate on the normal analog input or the test analog input. First and second offset correction values and first and second gain correction values are applied to outputs of the first and second ADCS, respectively, to produce first and second corrected outputs, respectively. A first test signal level is applied to the analog test input, and at least one of the first and second offset correction values is repetitively adjusted relative to the other as a function of a comparison of the first and second corrected outputs. In addition, a second test signal level, which is different than the first test signal level, is applied to the analog test input and at least one of the first and second gain correction values is repetitively adjusted relative to the other as a function of a comparison of the first and second corrected outputs.

BRIEF DESCRIPTION OF THE DRAWINGS

FIG. 1 is a block diagram of a multiple analog-to-digital converter (ADC) system according to one embodiment of the present invention.

FIG. 2 is a flowchart illustrating an offset adjustment process for the system shown in FIG. 1 according to one embodiment of the present invention.

FIG. 3 is a flowchart illustrating a gain adjustment process for the system shown in FIG. 1 according to one embodiment of the present invention.

DETAILED DESCRIPTION OF ILLUSTRATIVE EMBODIMENTS

FIG. 1 illustrates an analog-to-digital converter (ADC) system 100 according to one embodiment of the present invention. System 100 includes normal analog signal inputs 102, a start calibration input 103, a test signal source 104, ADCs 106 and 108 (units "A" and "B"), gain adjust circuits 110 and 112, offset adjust circuits 114 and 116, calibration control circuit 118 and corrected outputs 120 and 122. Normal input 102 can include a single analog signal input or a respective input for each ADC 106 and 108. Also, each of the analog signal inputs 102 can be single-ended or differential.

ADC 106 has multiplexed analog inputs 130 and 132, a mode select input 134 and a digital output 136. Analog input 130 is coupled to normal input 102, and analog input 132 is coupled to a test signal output 138 of test signal source 104. Mode select input 134 is coupled to receive a mode select signal from calibration control circuit 118.

Similarly, ADC 108 has multiplexed analog inputs 140 and 142, a mode select input 144 and a digital output 146. Analog input 140 is coupled to normal input 102, and analog input 142 is coupled to test signal output 138 of test signal source 104. Mode select input 144 is coupled to receive the mode select signal from calibration control circuit 118.

When system 100 is in a normal operating mode, the mode select signal applied to select inputs 134 and 144 cause ADCs 106 and 108 to sample the analog signal levels applied to inputs 130 and 140, respectively, and convert those samples into digital values on digital outputs 136 and 146. When system 100 is in a test mode, the select signal applied to select inputs 134 and 144 cause ADCs 106 and 108 to sample an analog test signal applied to inputs 132 and 142 by test signal source 104 and convert those samples into digital values on outputs on 136 and 146.

Gain adjust circuit 110 has an input 150 which is coupled to output 136 of ADC 106 and has a gain corrected output 154. Gain adjust circuit 110 receives the digital values on input 150 and applies a gain correction value $Y_A$ received on gain correction input 152 to produce a gain corrected output 154.

Similarly, gain adjust circuit 112 has an input 160 which is coupled to output 146 of ADC 108 and has a gain corrected output 164. Gain adjust circuit 112 receives the digital values on input 160 and applies a gain correction value $Y_B$ received on gain correction input 162 to produce a gain corrected output 164.

In one embodiment, gain adjust circuits 110 and 112 each include a digital multiplier, which multiplies the digital values received on inputs 150 and 160 by the gain correction values received on inputs 152 and 162 from calibration control circuit 118. The gain correction values are used to compensate for any differences in gain between ADCs 106 and 108. In one embodiment, the digital input values received on inputs 150 and 160 are considered to be unsigned binary numbers, and the gain correction values received on inputs 152 and 162 are considered to be scaled binary numbers, which represent values between 0 and 2.0 for example. Other digital formats and ranges can also be used.

Offset adjustment circuit 114 has an input 170, which is coupled to gain corrected output 154, and an offset correction input 172, which is coupled to receive an offset correction value $X_A$ from calibration control circuit 118. Offset adjustment circuit 114 receives the gain corrected output 154 from gain adjust circuit 110 and applies the offset correction value $X_A$ to produce a gain and offset corrected output value, Output Value(A), on output 174. Output 174 is coupled to corrected output 120.

Similarly, offset adjust circuit 116 has an input 180, which is coupled to gain corrected output 164, and an offset correction input 182, which is coupled to receive an offset correction value $X_B$ from calibration control circuit 118. Offset adjust circuit 116 applies the offset correction values to the gain corrected output 164 to produce a gain and offset corrected output value, Output Value(B), on output 184. Output 184 is coupled to corrected output 122. The offset correction values are used to compensate for any differences in offset characteristics between ADCs 106 and 108.

In one embodiment, offset adjust circuits 114 and 116 each include a digital adder, which adds the respective offset correction values received on inputs 172 and 182 to gain corrected outputs 154 and 164. In one embodiment the offset correction values are scaled signed binary values ranging from −1.0 to +1.0. Other ranges can also be used. The result of this addition becomes the respective output value on outputs 174 and 184.

Calibration control circuit 118 has an enable input 190, which is coupled to start calibration input 103, and comparison inputs 192 and 194, which are coupled to corrected outputs 120 and 122, respectively. Calibration control circuit 118 has an offset correction output 195, a gain correction output 196, a normal/test select output 197 and a test signal control output 198. Offset correction output 195 is coupled to offset correction inputs 172 and 182 of offset adjust circuits 114 and 116. Gain correction output 196 is coupled to gain correction inputs 152 and 162 of gain adjust circuits 110 and 112. Normal/test select output 197 is coupled to select inputs 134 and 144 of ADCs 106 and 108. Test signal select output 198 is coupled to select input 199 of test signal source 104.

In one embodiment, calibration control circuit 118 is implemented as a state machine in which the outputs 195, 196, 197 and 198 are functions of the inputs to the state machine and the current state of the machine. However, the function performed by calibration control circuit 118 can be performed by any suitable circuit in alternative embodiments of the present invention. For example, calibration control circuit 118 can include a programmed computer, a microprocessor, or any other circuit that is controlled by hardware, software or a combination of both hardware and software.

During normal operation, start calibration input 103 has an inactive state. When this input is inactive, calibration control circuit 118 sets normal/test select output 197 to the normal state, which causes ADCs 106 and 108 to sample the analog signals applied to normal inputs 102 and convert them to digital values. Gain adjust circuits 110 and 112 and offset adjust circuits 114 and 116 apply the present gain and offset correction values that are stored in calibration control circuit 118 to the converted values. In one embodiment, calibration control circuit 118 includes a register for storing each of the gain correction values $Y_A$ and $Y_B$ and each of the offset correction values $X_A$ and $X_B$. The resulting values, Output Value(A) and Output Value(B), are therefore corrected for mismatches for gain and offset between the ADCs.

When start calibration input 103 is in the active state, calibration control circuit 118 begins a routine for calibrating the values of $Y_A$, $Y_B$, $X_A$ and $X_B$ such that Output Value(A) is approximately equal to Output Value (B). Start calibration input 103 can be activated at any suitable time, such as when system 100 is powered-up, when system 100 is idle or at regularly planned intervals. Calibration control circuit 118 sets normal/test select output 197 to the test mode so that ADCs 106 and 108 sample the test signal provided by test signal source 104 on output 138.

In one embodiment, the analog test signal is selectable by calibration control circuit 118 through test signal select input 199. For example, the analog test signal can be forced to a relatively low level or a relatively high level, depending on the state of select input 199. Test signal source 104 can include any suitable type of signal source, which may dependent on the environment in which the circuit is implemented. For example, if a suitable digital-to-analog converter (DAC) is available, the DAC can be employed to provide the required test signals under the control of calibration control circuit 118. If a suitable voltage reference is available within the device, this voltage reference can be used as a test signal source. In addition, the test signals can be generated from an off-chip source. If ADCs 106 and 108 are implemented as differential ADCs, the switch between the low test signal and the high test signal can be accomplished by reversing the hook-up of a differential test signal to the differential inputs to the ADCs.

Calibration control circuit 118 controls test signal source 104 to sequentially apply the low and high levels to both ADCs 106 and 108 during different phases of the calibration sequence. In each phase, the converted results on outputs 120 and 122 are compared to one another by calibration control circuit 118.

When the low test signal is applied, the difference between Output Value(A) and Output Value(B) represents a mismatch in the offset characteristics of ADCs 106 and 108.

When the high test signal is applied, the difference between Output Value(A) and Output Value(B) represents a mismatch in the gain characteristics of ADCs 106 and 108. Calibration control circuit 118 adjusts the results of both conversions in parallel through gain adjust circuits 110 and 112 and offset adjust circuits 114 and 116 while solving the following equation for both units:

Output Value=(Raw Converter Value*Gain Correction Value)+ Offset Correction Value  EQ.1

When the low test signal is applied to ADCs 106 and 108, assume for example that an offset mismatch exists such that the raw converter output 136 of ADC 106 is greater than the raw converter output 146 of ADC 108. In this case, the offset correction will follow the following equations:

Output Value(A)=(Raw Converter Value(A)*Gain Correction($Y_A$=1))+Offset Correction($X_A$=−x)  EQ.2

Output Value(B)=(Raw Converter Value(B)*Gain Correction($Y_B$=1))+Offset Correction ($X_B$=+x)  EQ.3

In Equations 2 and 3, the gain correction value is initially assumed to be 1.0 for both units, and the offset correction values $X_A$ and $X_B$ are adjusted to correct the offset mismatch. Since in this example ADC output 136 is greater than ADC output 146, gain adjust circuit 114 receives a negative offset correction value $X_A$=−x, and gain adjust circuit 116 receives a positive correction value $X_B$=+x, where "x" is any scaled binary value. In one embodiment, the value "x" can range from −1.0 to +1.0. Other ranges can also be used.

When the high test signal is applied to ADCs 106 and 108, if we assume ADC 106 provides a smaller range of raw converter values on ADC output 136 than ADC 108 provides on ADC output 146, Equations 2 and 3 become:

Output Value(A)=(Raw Converter Value(A)*Gain Correction($Y_A$=1+y))+Offset Correction($X_A$)  EQ.4

Output Value (B)=(Raw Converter Value(B)*Gain Correction($Y_B$=1−Y))+Offset Correction($X_B$)  EQ.5 where "y" is a scaled binary number variable and the offset is assumed to be zero for both units. In an actual circuit, the gain correction factors (1+y) and (1−y) are not really complementary. The difference between the resulting values and the ideal values is small for small values y and will normally be insignificant and absorbed in the offset calibration or in the resolution of the correction factors.

With the system of equations shown in EQS. 2–5, the difference between the raw converter outputs of ADCs 106 and 108 is halved and then applied to both units in such a manner that the final, corrected output values on outputs 120 and 122 are equal. In one embodiment, calibration control circuit 118 employs a simple iterative approach to achieve convergence of Output Value(A) and Output Value(B) rather than attempting to directly solve the difference equations and applying the results to both units.

FIG. 2 is a flow chart illustrating an offset adjustment process 200 performed by calibration control circuit 118 according to one embodiment of the present invention. At step 201, calibration control circuit 118 controls test signal source 104 to apply the low test signal to ADCs 106 and 108 and places ADCs 106 and 108 in the test mode by switching the input to ADCs to sample the test signal. At step 202, ADCs 106 and 108 convert the sampled analog signal level to a digital value, which is applied to outputs 136 and 146.

At step 203, the present gain correction values $Y_A$ and $Y_B$ are applied to the digital values by gain adjust circuits 110 and 112. During the first pass through the overall calibration process loop, the gain correction values $Y_A$ and $Y_B$ are initialized to "1.0", for example. At step 204, the present offset correction values $X_A$ and $X_B$ are applied to the corrected gain outputs 154 and 156 by offset adjust circuits 114 and 116. Again, the offset correction values $X_A$ and $X_B$ are initialized to "0". The resulting gain and offset corrected output values are then provided to outputs 120 and 122.

At step 205, calibration control circuit 118 compares the corrected output values, Output Value(A) and Output Value (B). If Output Value(A) is greater than Output Value(B), calibration control circuit 118 determines, at step 206, whether the present iteration of loop 200 caused a change in the relative magnitudes of Output Value(A) and Output Value(B) as compared to the previous iteration. Similarly, if Output Value(A) is less than Output Value(B), calibration control circuit 118 determines, at step 207, whether the present iteration of loop 200 caused a change in the relative magnitudes of Output Value(A) and Output Value(B).

Calibration control circuit 118 monitors the relative magnitudes of Output Value(A) and Output Value(B) over successive comparisons to detect when adjustments to the offset correction values $X_A$ and $X_B$ causes one of the corrected output values that was previously greater than (or less than) the other output value to become less than (or greater than) the other output value. This can be detected by detecting a change in polarity at the output of the comparator that is used by circuit 118 to compare Output Value(A) and Output Value(B), for example.

Since this is the first iteration of step 205, no change in state has occurred, and the offset adjust loop proceeds either to step 208 or step 210 depending on the relative magnitudes of Output Value(A) and Output Value (B). If Output Value (A) is greater than Output Value(B), offset correction value $X_A$ is decremented by one correction unit, and offset correction value $X_B$ is incremented by one correction unit at step 208. If Output Value(A) is less than Output Value(B), offset correction value $X_B$ is decremented by one correction unit, and offset correction value $X_A$ is incremented by one correction unit at step 210. In an alternative embodiment, only one of the two correction values $X_A$ and $X_B$ is adjusted at step 208. Also, $X_A$ and $X_B$ can be adjusted by the same incremental value or by different incremental values.

Calibration control circuit 118 stores the new values of $X_A$ and $X_B$ in respective internal registers, and outputs the new values to offset adjust circuits 114 and 116, which then apply those values at 204. The resulting Output Values (A) and (B) are again compared by calibration control circuit 118 at step 205. If Output Value(A) continues to be greater than (or less than) Output Value(B) such that there has been no change in polarity of the comparison result, the offset correction values $X_A$ and $X_B$ are again adjusted at step 208 (or step 210). $X_A$ is decremented (or incremented) by another unit and $X_B$ is incremented (or decremented) by another unit. Calibration control circuit 118 again applies the new, present values of $X_A$ and $X_B$ to offset adjust circuits 114 and 118 at step 204. This process continues until the polarity of the comparison between Output Value(A) and Output Value(B) changes state. At this point, step 206 or 207 detects that there has been a change in polarity of the comparison output.

Calibration control circuit 118 then revokes the last increment/decrement of $X_A$ and $X_B$ at step 209 and applies the present values of $X_A$ and $X_B$ to offset adjust circuits 114 and 116 to complete the offset adjustment loop.

Once the offset adjustment loop has completed, calibration control circuit 118 adjusts the gain correction values $Y_A$ and $Y_B$. FIG. 3 is a flow chart illustrating a gain adjustment process 300 according to one embodiment of the present invention. At step 301, calibration control circuit 118 controls test signal source 104 to generate the high test signal on output 138. At step 302, ADCs 106 and 108 sample the high test signal and convert the samples to digital values on outputs 136 and 146. At step 303, gain adjust circuits 110 and 112 apply the present gain correction values $Y_A$ and $Y_B$. At step 304, calibration control circuit 118 applies the present offset correction values $X_A$ and $X_B$, as previously adjusted by offset adjustment loop 200, through offset adjust circuits 114 and 116.

At step 305, calibration control circuit compares Output Value(A) with Output Value(B). If Output Value(A) is greater than Output Value(B) and if the present iteration through loop 300 did not cause a change in the comparison polarity, as detected at step 306, calibration control circuit decrements gain correction value $Y_A$ and increments gain correction value $Y_B$ at step 307. Similarly, if Output Value (B) is greater than Output Value(A) and there has been no change in the comparison polarity from a previous iteration of step 305, as detected at step 308, calibration control circuit decrements $Y_B$ and increments $Y_A$, at step 309. The incremented/decremented values of $Y_A$ and $Y_B$ are stored in respective internal registers within calibration control circuit 118.

Calibration control circuit 118 then applies the newly updated gain correction values to gain adjust circuits 110 and 112. However, after each corrective step 307 or 309, calibration control circuit 118 returns to offset adjustment loop 200 to verify that the update to the gain correction values has not caused the offset between ADCs 106 and 108 to change. If the offset changes, it is corrected in loop 200 before returning to gain adjust loop 300.

Offset adjustment loop 200 is therefore repeated at steps 314 and 315. Once the offset correction values $X_A$ and $X_B$ have been further corrected, if necessary, calibration control circuit 118 returns to step 301 and reapplies the high test signal to ADCs 106 and 108. The high test signal is again converted to digital values by ADCs 16 and 108, the present gain and offset correction values are applied at steps 303 and 304, and the corrected outputs are compared at step 305.

This process repeats until the initially lesser one of Output Value(A) and Output Value(B) exceeds the other one of Output Values (A) and (B). This change in relative magnitude is detected at step 306 or 308, and the last increment/decrement of $Y_A$ and $Y_B$ that caused the change is revoked at step 312.

In this manner, both the gain correction values and the offset correction values are adjusted until the corrected outputs are the same for both the high and low test signals. When the calibration sequence is complete, calibration control circuit 118 sets a status bit. A host system can monitor this status bit to detect when the calibration sequence is complete. The host system can also monitor the current values of the gain and offset correction registers of both ADCs.

The choice of analog signal levels for the high and low test signals may change depending on the particular application in which the circuit is used. For example, the low test signal can be set to ¼ of the input range of ADCs 106 and 108, and the high test signal can be set at approximately ¾ of the input range. These settings provide enough headroom at both ends of the input range to adjust the results without limiting the output values. A choice of low and high signal levels that are closer to the extremes of the ADC input range may cause limiting within the ADCs themselves and also within the gain or offset adjustment circuits. The absolute values of the low and high test signals are unimportant. They should be quite different from one another but do not need to have any particular value. Also, the test signal could be high or low for either gain or offset correction.

The calibration sequence shown in FIGS. 2 and 3 can be initiated by a start signal at anytime. In this sense, each calibration sequence is independent of previous calibration sequences. The only difference between the first all following calibration sequences is that a following calibration sequence may start without resetting the offset and gain correction values from its predecessor. However, this is a system level decision, and the calibration values may be reset at any time.

In an alternative embodiment, the gain and offset correction values are fully adjusted, rather than incrementally adjusted, with each pass through the gain and offset adjustment loops. In this alternative embodiment, calibration control circuit 118 solves the appropriate difference equations, such as EQS. 2 and 3 or EQS. 4 and 5, with each pass through the offset or gain adjustment loops. The resulting offset correction and gain correction are then each applied to one ADC unit or split or otherwise portioned and applied to both ADC units such that the corrected outputs from both units are substantially the same. In another alternative embodiment, calibration control circuit 118 uses a successive approximation technique through a sequence of steps that are performed for each calibration.

Although the present invention has been described with reference to preferred embodiments, workers skilled in the art will recognize that changes may be made in form and detail without departing from the spirit and scope of the invention. For example, the order in which the gain and offset adjust circuits are coupled to the outputs of the ADCs can be reversed. Also, the order in which the correction values are calibrated can be reversed in alternative embodiments of the present invention. The particular calibration sequences shown in FIGS. 2 and 3 can be modified as desired. Also, any number of multiple ADCs can be calibrated in a similar fashion. Other changes can also be made.

What is claimed is:

1. A method of calibrating first and second analog-to-digital converters (ADCs), the method comprising:
    a) applying a first test signal to the first and second ADCs;
    b) applying a first correction value to an output of the first ADC to produce a first corrected output;
    c) applying a second correction value to an output of the second ADC to produce a second corrected output;
    d) comparing the first and second corrected outputs to identify a greater one and a lesser one of the first and second corrected outputs;
    e) adjusting at least one of the first and second correction values relative to the other; and
    f) after step e), repeating steps b) through e) until the first or second corrected output that was identified as the lesser one exceeds the other.

2. The method of claim 1 wherein step e) comprises:
    e)1) incrementing the respective first or second correction value of the lesser corrected output; and
    e)2) decrementing the respective first or second correction value of the greater corrected output.

3. The method of claim 2 and further comprising:
    g) revoking a most recent adjustment performed in step e) when, during a present iteration of step d), the adjustment results in the lesser corrected output identified in a previous iteration of step d) exceeding the greater corrected output identified in the previous iteration of step d).

4. The method of claim 1 wherein the first and second correction values comprise first and second gain correction values, respectively, and wherein:
   step b) comprises multiplying the output of the first ADC by the first gain correction value to produce the first corrected output; and
   step c) comprises multiplying the output of the second ADC by the second gain correction value to produce the second corrected output.

5. The method of claim 1 wherein the first and second correction values comprise first and second offset correction values, respectively, and wherein:
   step b) comprises adding the first offset correction value to the output of the first ADC to produce a first offset corrected output; and
   step c) comprises adding the second offset correction value to the output of the second ADC to produce the second offset corrected output.

6. The method of claim 5 and further comprising:
   g) applying a second test signal to the first and second ADCs, which is greater than the first test signal;
   h) applying a first gain correction value to the output of the first ADC to produce a first gain corrected output;
   i) applying a second gain correction value to the output of the second ADC to produce a second gain corrected output;
   j) comparing the first and second gain corrected outputs while applying the second test signal in step g) to identify a greater one and a lesser one of the first and second gain corrected outputs;
   k) adjusting at least one of the first and second gain correction values relative to the other; and
   l) after step k), repeating steps h) through k) until the first or second gain corrected output that was identified in step j) as the lesser one exceeds the other.

7. The method of claim 6 and further comprising: m) revoking a most recent adjustment performed in step k) when, during a present iteration of step j), the adjustment results in the lesser gain corrected output identified in a previous iteration of step j) exceeding the greater gain corrected output identified in the previous iteration of step j).

8. The method of claim 6 wherein:
   step b) comprises applying the first offset correction value to the first gain corrected output to produce a first gain and offset corrected output;
   step c) comprises applying the second offset correction value to the second gain corrected output to produce a second gain and offset corrected output; and
   step d) comprises comparing the first and second gain and offset corrected outputs while applying the first test signal in step a) to identify a greater one and a lesser one of the first and second corrected outputs.

9. The method of claim 8 wherein steps a) through f) are performed in an offset adjustment loop and steps g) through l) are performed in a gain adjustment loop and wherein the gain adjustment loop further comprises:
   m) repeating the offset adjustment loop after adjusting at least one of the first and second gain correction values relative to the other in step k) of the gain adjustment loop.

10. The method of claim 9 wherein step m) comprises repeating the offset adjustment loop only if a most recent adjustment performed in step k) when, during a present iteration of step j), the adjustment results in the lesser gain and offset corrected output identified in a previous iteration of step j) remaining less than the greater gain and offset corrected output identified in the previous iteration of step j).

11. An analog-to-digital converter (ADC) system comprising:
   a normal analog input;
   a test analog input;
   a first ADC which selectively operates on either the normal analog input or the test analog input and has a digital output;
   a second ADC which selectively operates on either the normal analog input or the test analog input and has a digital output;
   a first correction circuit adapted to modify the digital output of the first ADC by a first gain correction value and a first offset correction value to produce a first corrected output;
   a second correction circuit adapted to modify the digital output of the second ADC by a second gain correction value and a second offset correction value to produce a second corrected output; and
   a calibration control circuit having first and second comparison inputs coupled to the first and second corrected outputs, respectively, and generating the first and second gain correction values and the first and second offset correction values as a function of a comparison of the first and second corrected outputs.

12. The ADC system of claim 11 wherein:
   the first correction circuit comprises a first gain adjust circuit coupled to the digital output of the first ADC and a first offset adjust circuit coupled to an output of the first gain adjust circuit; and
   the second correction circuit comprises a second gain adjust circuit coupled to the digital output of the second ADC and a second offset adjust circuit coupled to an output of the second gain adjust circuit.

13. The ADC system of claim 11 wherein the calibration control circuit comprises means for:
   a) applying a first signal level to the analog test input and controlling the first and second ADCs to operate on the analog test input;
   b) applying the first offset correction value to the first correction circuit to produce the first corrected output;
   c) applying the second offset correction value to the second correction circuit to produce the second corrected output;
   d) comparing the first and second corrected outputs while applying the analog test signal in step a) to identify a greater one and a lesser one of the first and second corrected outputs;
   e) adjusting at least one of the first and second offset correction values relative to the other; and
   f) after step e), repeating steps b) through e) until in a present iteration of step d) the lesser corrected output identified in a previous iteration of step d) exceeds the greater corrected output identified in the previous iteration of step d.

14. The ADC system of claim 11 wherein the calibration control circuit comprises means for:
   a) applying a second signal level, which is different than the first signal level, to the analog test input and controlling the first and second ADCs to operate on the analog test input;

b) applying the first gain correction value to the first correction circuit to produce the first corrected output;

c) applying the second gain correction value to the second correction circuit to produce the second corrected output;

d) comparing the first and second corrected outputs while applying the analog test signal in step a) to identify a greater one and a lesser one of the first and second corrected outputs;

e) adjusting at least one of the first and second gain correction values relative to the other; and f) after step e), repeating steps b) through e) until in a present iteration of step d) the lesser corrected output identified in a previous iteration of step d) exceeds the greater corrected output identified in the previous iteration of step d).

15. A multiple analog-to-digital converter (ADC) system comprising:

a normal analog input;

a test analog input;

first and second ADCs selectively operating on the normal analog input or the test analog input;

means for applying first and second offset correction values and first and second gain correction values to outputs of the first and second ADCs, respectively, to produce first and second corrected outputs, respectively;

means for applying a first test signal level to the analog test input and repetitively adjusting at least one of the first and second offset correction values relative to the other as a function of a comparison of the first and second corrected outputs; and means for applying a second test signal level, which is different than the first test signal level, to the analog test input and repetitively adjusting at least one of the first and second gain correction values relative to the other as a function of a comparison of the first and second corrected outputs.

* * * * *